(12) United States Patent
Fitz

(10) Patent No.: US 6,541,288 B1
(45) Date of Patent: Apr. 1, 2003

(54) METHOD OF DETERMINING SEMICONDUCTOR LASER FACET REFLECTIVITY AFTER FACET REFLECTANCE MODIFICATION

(75) Inventor: John L. Fitz, Baltimore, MD (US)

(73) Assignee: The United States of America as represented by the National Security Agency, Washington, DC (US)

( * ) Notice: Subject to any disclaimer, the term of this patent is extended or adjusted under 35 U.S.C. 154(b) by 0 days.

(21) Appl. No.: 10/052,102

(22) Filed: Jan. 18, 2002

Related U.S. Application Data
(60) Provisional application No. 60/317,597, filed on Sep. 7, 2001.

(51) Int. Cl.⁷ .......................... H01L 21/66; G01R 31/26
(52) U.S. Cl. ........................................ 438/16; 356/445
(58) Field of Search ................................ 438/7, 14, 16, 438/22, 28, 29, 38; 356/445, 448; 372/50, 97, 98, 99

(56) References Cited

U.S. PATENT DOCUMENTS

| | | | |
|---|---|---|---|
| 4,660,983 A | * | 4/1987 | Yamamoto et al. .......... 356/445 |
| 4,953,974 A | * | 9/1990 | Fritz .......................... 356/128 |
| 5,103,106 A | | 4/1992 | Golberstein |
| 5,848,088 A | | 12/1998 | Mori et al. |
| 6,052,191 A | | 4/2000 | Brayden, Jr. et al. |
| 6,054,868 A | | 4/2000 | Borden et al. |

FOREIGN PATENT DOCUMENTS

EP  1223647 A  *  7/2002

OTHER PUBLICATIONS

D. F. Welch et al., "High–Brightness, High–Efficiency, Single–Quantum–Well Laser Diode Array", Electron Lett., vol. 23, No. 23, pp. 1240–1241, Nov. 5, 1987, IEEE.

* cited by examiner

*Primary Examiner*—Savitri Mulpuri
(74) *Attorney, Agent, or Firm*—Robert D. More LLP

(57) ABSTRACT

A method of measuring reflectivity of a semiconductor laser facet by first fabricating first and second semiconductor lasers. The reflectance of the facets of the lasers are then determined. The threshold current densities of the lasers are then measured. If the reflectance of the first facet of the first semiconductor laser is modified then setting u=1, x=1, and y=1. If the reflectance of the first facet and the second facet of the first semiconductor laser are modified to the same extent then setting u=1, x=1, and y=0.5. The threshold current density of the first semiconductor laser after reflectivity modification is then measured. The reflectance of the modified first semiconductor laser is then calculated as follows:

$$R_1=(u)\{(R_0)\mathrm{Exp}[x-(2y[(1/L_1)-(1/L_2)]L_1(J_1-J_3)/(J_1-J_2))]\}.$$

8 Claims, 4 Drawing Sheets

---

1. MAKING 1ST AND 2ND LASERS WITH LENGTHS L1 & L2

2. FINDING FACET REFLECTANCE R0 OF 1ST AND 2ND LASERS

3. FINDING THRESHOLD CURRENT DENSITY J1 OF 1ST LASER

4. FINDING THRESHOLD CURRENT DENSITY J2 OF 2ND LASER

5. SETTING U=1, X=1, Y=1 IF REFLECTANCE OF ONLY 1ST LASER'S FIRST FACET IS MODIFIED

6. SETTING U=1, X=1, Y=0.5 IF REFLECTANCE OF BOTH OF 1ST LASER'S FACETS ARE MODIFIED TO THE SAME EXTENT

7. SETTING U=1, X=1, Y=1 IF REFLECTANCE OF ONLY 1ST LASER'S 2ND FACET IS MODIFIED

8. FINDING THRESHOLD CURRENT DENSITY J3 OF MODIFIED 1ST LASER

9. FINDING REFLECTANCE OF 1ST LASER'S MODIFIED FACETS AS $$R1=(u)\{(R0)\mathrm{Exp}[x-(2y[(1/L1)-(1/L2)]L1(J1-J3)/(J1-J2))]\}$$

1. MAKING 1ST AND 2ND LASERS WITH LENGTHS L1 & L2

2. FINDING FACET REFLECTANCE R0 OF 1ST AND 2ND LASERS

3. FINDING THRESHOLD CURRENT DENSITY J1 OF 1ST LASER

4. FINDING THRESHOLD CURRENT DENSITY J2 OF 2ND LASER

5. SETTING U=1, X=1, Y=1 IF REFLECTANCE OF ONLY 1ST LASER'S FIRST FACET IS MODIFIED

6. SETTING U=1, X=1, Y=0.5 IF REFLECTANCE OF BOTH OF 1ST LASER'S FACETS ARE MODIFIED TO THE SAME EXTENT

7. SETTING U=1, X=1, Y=1 IF REFLECTANCE OF ONLY 1ST LASER'S 2ND FACET IS MODIFIED

8. FINDING THRESHOLD CURRENT DENSITY J3 OF MODIFIED 1ST LASER

9. FINDING REFLECTANCE OF 1ST LASER'S MODIFIED FACETS AS $R1=(u)\{(R0)Exp[x-(2y[(1/L1)-(1/L2)]L1(J1-J3)/(J1-J2))]\}$

FIG. 1

21. SETTING U=R1 OF 1ST LASER'S FIRST FACET, X=0, Y=1 IF REFLECTANCE OF 1ST LASER'S 1ST FACET IS FURTHER MODIFIED AND 1ST LASER'S 2ND FACET IS NOT MODIFIED

22. SETTING U=R1 OF 1ST LASER'S 1ST FACET, X=0, Y=0.5 IF REFLECTANCE OF 1ST LASER'S 1ST AND 2ND FACETS ARE FUTHER MODIFIED TO THE SAME EXTENT

23. FINDING THRESHOLD CURRENT DENSITY J4 OF FURTHER MODIFIED 1ST LASER

24. FINDING REFLECTANCE OF FURTHER MODIFIED 1ST LASER AS $R2=(u)\{(R0)Exp[x-(2y[(1/L1)-(1/L2)]L1(J1-J4)/(J1-J2))]\}$

FIG. 2

31. SETTING U=R2, X=0, Y=1 IF REFLECTANCE OF 1ST LASER'S 1ST FACET IS YET FURTHER MODIFIED AND REFLECTANCE OF 1ST LASER'S 2ND FACET IS NOT FURTHER MODIFIED

32. FINDING THRESHOLD CURRENT DENSITY J5 OF YET FURTHER MODIFIED 1ST LASER

33. FINDING REFLECTANCE OF YET FURTHER MODIFIED 1ST LASER AS $$R3 = (u)\{(R0)Exp[x-(2y[(1/L1)-(1/L2)]L1(J1-J5)/(J1-J2))]\}$$

FIG. 3

41. SETTING U=1, X=1, Y=1 IF REFLECTANCE OF 1ST LASER'S 1ST FACET IS FURTHER MODIFIED AND 1ST LASER'S 2ND FACET IS NOT FURTHER MODIFIED

42. SETTING U=R1 OF 1ST LASER'S 2ND FACET, X=0, Y=1 IF REFLECTANCE OF 1ST LASER'S 1ST FACET IS NOT FURTHER MODIFIED AND 1ST LASER'S 2ND FACET IS FURTHER MODIFIED

43. FINDING THRESHOLD CURRENT DENSITY J6 OF MODIFIED 1ST LASER

44. FINDING REFLECTANCE OF EACH MODIFIED FACET OF 1ST LASER AS $$R4 = (u)\{(R0)Exp[x-(2y[(1/L1)-(1/L2)]L1(J1-J6)/(J1-J2))]\}$$

FIG. 4

METHOD OF DETERMINING SEMICONDUCTOR LASER FACET REFLECTIVITY AFTER FACET REFLECTANCE MODIFICATION

This application claims the benefit of U.S. Provisional Application No. 60/317,597, filed Sep. 7, 2001.

FIELD OF THE INVENTION

The present invention relates, in general, to optics measuring and testing and, in particular, to lens or reflective image former testing.

BACKGROUND OF THE INVENTION

Light is produced by the transition of electrons from higher energy states to lower energy states. The law of conservation of energy is satisfied in these transition processes by the emission of a photon, or quantum of light, whose energy corresponds to the difference in energy of the initial and final energy states of the electron. In nature, photons are created spontaneously at many different frequencies. In Light Amplification by Stimulated Emission of Radiation (laser), a light-wave having a wavelength that corresponds to the difference between a high energy state and a low energy state that strikes an electron in the high energy state will cause the electron to transition to the low energy state and emit a photon with the same direction, phase, polarization and frequency as the incident photon of the light wave. Thus, a traveling light wave of a certain frequency is produced.

A semiconductor ridge laser is useful as an element in a photonic integrated circuit because it emits light horizontally which can be processed by another element which is formed on the horizontal plane of the substrate of the photonic integrated circuit. A ridge laser, which includes an active layer in which a traveling light wave is stimulated, has been produced by many different means. Reflectance modification can be applied on each end, or facet, of the ridge laser to reflect light in a desired phase. The reflectivity of a facet after reflectance modification is a measure of the amount of light that the reflectance modified facet directs back into the laser. An increase in reflectivity causes an increase in the amount of light to be reflected back into, and a lower loss from, a laser. The gain available for laser operation is proportional to the length of the laser cavity. A lower loss allows a laser to operate with lower gain, and hence, a shorter cavity length. A shorter laser is more attractive as an element in a photonic integrated circuit than a longer laser because the shorter laser occupies less space on the integrated circuit and, therefore, more of them may be used per unit area. The functionality of a photonic integrated circuit is proportional to the packing density of the elements of the integrated circuit. Therefore, reflectivity is an important design criteria for lasers. If the reflectivity of a facet after reflectance modification can be measured more accurately, then the parameters of a laser (e.g., length, types of reflectance modification processes used) may be optimized for a desired performance level.

In an article entitled "HIGH-BRIGHTNESS, HIGH-EFFICIENCY, SINGLE-QUANTUM-WELL LASER DIODE ARRAY," by D. F. Welch et al., published by the IEE in the Nov. 5, 1987 issue of *Electronics Letters*, Vol. 23, No. 23, pp. 1240–1241, an equation is disclosed that relates threshold current density of a laser to the reflectivity of the facets on each end of the laser. The equation is as follows:

$$J_{th} = J_t + (d/\Gamma A)[\alpha + ([ln(1/R_1 R_2)]/2L)],$$

where $J_{th}$ is threshold current density, $J_t$ is transparency current density, d is quantum-well thickness, $\Gamma$ is the confinement factor of the laser, A is a constant equal to 0.043 cm um/A, $\alpha$ is internal loss, $R_1$ is the reflectivity of the front facet, $R_2$ is the reflectivity of the rear facet, and L is the cavity length of the laser.

The equation does not disclose the method of the present invention.

U.S. Pat. No. 5,103,106, entitled "REFLECTIVE OPTICAL INSTRUMENT FOR MEASURING SURFACE REFLECTANCE," discloses a device for measuring characteristics of a specimen by projecting a beam onto the specimen at a certain angle and receiving the beam reflected off of the specimen at the same angle by one or more photo-sensors. The present invention does not measure reflectance as does U.S. Pat. No. 5,103,106. U.S. Pat. No. 5,103,106 is hereby incorporated by reference into the specification of the present invention.

U.S. Pat. No. 5,848,088, entitled "SURFACE EMISSION TYPE SEMICONDUCTOR FOR LASER WITH OPTICAL DETECTOR, METHOD OF MANUFACTURING THEREOF, AND SENSOR USING THE SAME," discloses a method of measuring reflectance by shining a light at a particular wavelength at a semiconductor layer and a mirror thereon, detecting the spectrum reflected, and measuring the profile of the light reflected. The present invention does not measure reflectance as does U.S. Pat. No. 5,848,088. U.S. Pat. No. 5,848,088 is hereby incorporated by reference into the specification of the present invention.

U.S. Pat. No. 6,052,191, entitled "COATING THICKNESS MEASUREMENT SYSTEM AND METHOD OF MEASURING A COATING THICKNESS," discloses a device for and method of measuring the thickness of a coating by shining a light source at a particular angle, collecting the light reflected off of the coating, measuring the intensity of the reflected beam to determine the reflectivity of the coating. The present invention does not measure reflectance as does U.S. Pat. No. 6,052,191. U.S. Pat. No. 6,052,191 is hereby incorporated by reference into the specification of the present invention.

U.S. Pat. No. 6,054,868, entitled "APPARATUS AND METHOD FOR MEASURING A PROPERTY OF A LAYER IN A MULTILAYERED STRUCTURE," discloses a device for and method of measuring reflectance by focusing a heating beam onto a region in which a probe beam travels, modulating the power of the heating beam, measuring the reflected power in the probe beam to determine the reflectivity of the region. The present invention does not measure reflectance as does U.S. Pat. No. 6,054,868. U.S. Pat. No. 6,054,868 is hereby incorporated by reference into the specification of the present invention.

SUMMARY OF THE INVENTION

It is an object of the present invention to determine the reflectivity of at least one semiconductor laser facet after the reflectance of the facet has been modified.

It is another object of the present invention to determine the reflectivity of at least one semiconductor laser facet after reflectance modification without having to measure the intensity of a reflected beam but by measuring the threshold current density of a semiconductor laser before and after facet reflectance modification.

The present invention is a method of determining reflectivity of a semiconductor laser facet. The first step of the method is fabricating a first semiconductor laser and a second semiconductor laser. The first laser has a cavity length $L_1$ while the second laser cavity length $L_2$. Manufacturing of the lasers is such that the facet reflectivity $R_0$ is the same for the first and second semiconductor lasers.

The second step of the method is determining what is the facet reflectance $R_0$.

The third step of the method is measuring a threshold current density $J_1$ of the first semiconductor laser.

The fourth step of the method is measuring a threshold current density $J_2$ of the second semiconductor laser.

The fifth step of the method is setting variables u=1, x=1, and y=1 if the reflectance of the first facet of the first semiconductor laser is modified and the second facet of the first semiconductor laser is not modified.

The sixth step of the method is setting variables u=1, x=1, and y=0.5 if the reflectance of the first facet and the second facet of the first semiconductor laser are modified to the same extent.

The seventh step of the method is setting u=1, x=1, and y=1 if the reflectance of the first facet of the first semiconductor laser is not modified and the second facet of the first semiconductor laser is modified.

The eighth step of the method is measuring a threshold current density $J_3$ of the modified first semiconductor laser.

The ninth step of the method is determining the reflectance of the first semiconductor laser as follows:

$$R_1=(u)\{(R_0)\mathrm{Exp}[x-(2y[(1/L_1)-(1/L_2)]L_1(J_1-J_3)/(J_1-J_2))]\},$$

where $\mathrm{Exp}[x-(2y[(1/L_1)-(1/L_2)]L_1(J_1-J_3)/(J_1-J_2))]$ is an exponentiation function that makes the expression within the brackets the exponent of the preceding entity.

BRIEF DESCRIPTION OF THE DRAWINGS

FIG. 1 is a list of the steps of the preferred embodiment;

FIG. 2 is a list of the steps of a first alternate embodiment;

FIG. 3 is a list of the steps of a second alternate embodiment; and

FIG. 4 is a list of the steps of a third alternate embodiment.

DETAILED DESCRIPTION

The present invention is a method of determining the reflectivity of a facet of a semiconductor laser after its reflectance has been modified. In the preferred embodiment, the semiconductor laser is a semiconductor ridge laser, but any other suitable semiconductor laser will do.

FIG. 1 is a list of the steps of the preferred embodiment of the present invention. The first step 1 of the method is fabricating a first semiconductor laser and a second semiconductor laser with different cavity lengths $L_1$ and $L_2$, respectively. The first and second semiconductor lasers each have a first facet on one end and a second facet on the other end. The first and second semiconductor lasers are fabricated to have the same initial facet reflectance $R_0$. The first and second semiconductor lasers may be fabricated to have uncoated (i.e., bare) facets or coated facets. In the preferred embodiment, accuracy of the present method is improved by making $L_1$ shorter than $L_2$. To avoid errors due to process variations, a number of first and second semiconductor lasers may be fabricated instead of one each so that an average of various measurements required by the present invention may be made instead of relying on a single measurement which may be in error.

The second step 2 of the method is determining the facet reflectance $R_0$ of the first and second semiconductor lasers. If the lasers were fabricated with a coating on the facets then $R_0$ must be determined empirically. If the facets of the lasers are bare, the following equation may be used to determine $R_0$:

$$R_0=[(n_L-n_M)/(n_L+n_M)]^2,$$

where $n_L$ is the index of refraction of either the first or second semiconductor laser, and where $n_M$ is the index of refraction of a transmission medium. If the transmission medium is air, $n_M=1$. The index of refraction of the semiconductor laser in question $n_L$ is determined as follows:

$$n_L=\lambda_0[(\lambda_0/2L)(1/d\lambda_0)+(-1\times10^4 \text{ cm}^{-1})],$$

where $\lambda_0$ is the free space wavelength of the semiconductor laser in question; where $d\lambda_0$ is the wavelength mode spacing of the semiconductor laser in question; and where L is the cavity length of the semiconductor laser in question.

The third step 3 of the method is measuring a threshold current density $J_1$ of the first semiconductor laser. If multiple first semiconductor lasers were fabricated then the third step 3 is measuring each threshold current density of the lasers and averaging the results to arrive at one representative threshold current density for the group of first semiconductor lasers.

The fourth step 4 of the method is measuring a threshold current density $J_2$ of the second semiconductor laser. If multiple second semiconductor lasers were fabricated then the fourth step 4 is measuring each threshold current density of the lasers and averaging the results to arrive at one representative threshold current density for the group of first semiconductor lasers.

The fifth step 5 of the method is setting variables u=1, x=1, and y=1 if the reflectance of the first facet of the first semiconductor laser is modified and the second facet of the first semiconductor laser is not modified. These variables will be plugged into an equation below for determining the reflectance of the modified facet.

The sixth step 6 of the method is setting variables u=1, x=1, and y=0.5 if the reflectance of the first facet and the second facet of the first semiconductor laser are modified to the same extent.

The seventh step 7 of the method is setting u=1, x=1, and y=1 if the reflectance of the first facet of the first semiconductor laser is not modified and the second facet of the first semiconductor laser is modified.

The eighth step 8 of the method is measuring a threshold current density $J_3$ of the modified first semiconductor laser.

The ninth, and last, step 9 of the method is determining the reflectance of each modified facet of the first semiconductor laser as follows:

$$R_1=(u)\{(R_0)\mathrm{Exp}[x-(2y[(1/L_1)-(1/L_2)]L_1(J_1-J_3)/(J_1-J_2))]\},$$

where $\mathrm{Exp}[x-(2y[(1/L_1)-(1/L_2)]L_1(J_1-J_3)/(J_1-J_2))]$ is an exponentiation function that makes the expression within the brackets the exponent of the preceding entity.

FIG. 2 is a list of the steps of a first alternate embodiment of the present method. The first alternate embodiment is a method of determining facet reflectivity, starting with a semiconductor laser, where each facet of the semiconductor laser has reflectivity $R_1$ as determined above that is different from the facet reflectivity $R_0$ of the semiconductor laser as originally fabricated, further modifying the reflectivity of one or both facets, and determining the reflectivity of the modified facet. The first step 21 of the first alternate embodiment is setting variables u equal to the reflectance $R_1$ of the first facet of the first semiconductor laser, x=0, and y=1 if the reflectance of the first facet of the first semiconductor laser is further modified and the second facet of the first semiconductor laser is not modified.

The second step 22 of the first alternate embodiment is setting variables u equal to the reflectance $R_1$ of the first facet of the first semiconductor laser, x=0, and y=0.5 if the reflectance of the first facet of the first semiconductor laser and the second facet of the first semiconductor laser are further modified to the same extent.

The third step 23 of the first alternate embodiment is measuring a threshold current density $J_4$ of the further modified first semiconductor laser. To reduce errors due to process variation, a number of first semiconductor lasers may be used to find the average of the threshold current density and using the average as representative of the threshold current density of each laser.

The fourth step 24 of the first alternate embodiment is determining the facet reflectance of the further modified first semiconductor laser as follows:

$$R_2=(u)\{(R_0)\mathrm{Exp}[x-(2y[(1/L_1)-(1/L_2)]L_1(J_1-J_4)/(J_1-J_2))]\},$$

where $\mathrm{Exp}[x-(2y[1/L_1)-(1/L_2)]L_1(J_1-J_4)/(J_1-J_2))]$ is an exponentiation function that makes the expression within the brackets the exponent of the preceding entity.

FIG. 3 is a list of the steps of a second alternate embodiment of the present method. The second alternate embodiment is a method of determining facet reflectivity, starting with a semiconductor laser, where a first facet of the semiconductor laser has reflectivity $R_2$ as determined above that is different from the facet reflectivity $R_0$ of the semiconductor laser as originally fabricated, where a second facet of the semiconductor laser has reflectivity $R_1$ as determined above that is different from the facet reflectivity $R_0$ of the semiconductor laser as originally fabricated, further modifying the reflectivity of the first facet, and determining the reflectivity of the modified facet. The first step 31 of the second alternate embodiment is setting variables u=$R_2$, x=0, and y=1 if the reflectance of the first facet of the first semiconductor laser is yet further modified and the reflectivity of the second facet of the first semiconductor laser is not further modified.

The second step 32 of the second alternate embodiment is measuring a threshold current density $J_5$ of the yet further modified first semiconductor laser. If multiple lasers are used to avoid errors due to process variations then an average threshold current density is used as the threshold current density of each of the lasers.

The third step 33 of the second alternate embodiment is determining the facet reflectance of the yet further modified first semiconductor laser as follows:

$$R_3=(u)\{(R_0)\mathrm{Exp}[x-(2y[(1/L_1)-(1/L_2)]L_1(J_1-J_5)/(J_1-J_2))]\},$$

where $\mathrm{Exp}[x-(2y[(1/L_1)-(1/L_2)]L_1(J_1-J_5)/(J_1-J_2)))]$ is an exponentiation function that makes the expression within the brackets the exponent of the preceding entity.

FIG. 4 is a list of the steps of a third alternate embodiment of the present method. The third alternate embodiment is a method of determining facet reflectivity, starting with a semiconductor laser, where a first facet of the semiconductor laser has reflectivity $R_0$ as originally fabricated, where a second facet of the semiconductor laser has reflectivity $R_1$ as determined above that is different from the facet reflectivity $R_0$, further modifying the reflectivity of one of the facets, and determining the reflectivity of the modified facet. The first step 41 of the third alternate embodiment is setting variables u=1, x=1, and y=1 if the reflectance of the first facet of the first semiconductor laser is further modified and the second facet of the first semiconductor laser is not further modified.

The second step 42 of the third alternate embodiment is setting variables u equal to the reflectance $R_1$ of the second facet of the first semiconductor laser, x=0, and y=1 if the reflectance of the first facet of the first semiconductor laser is not further modified and the second facet of the first semiconductor laser is further modified.

The third step 43 of the third alternate embodiment is measuring a threshold current density $J_6$ of the modified first semiconductor laser. If multiple lasers are used to avoid errors due to process variations then an average threshold current density is used as the threshold current density of each of the lasers.

The fourth step 44 of the third alternate embodiment is determining the reflectance of each modified facet of the first semiconductor laser as follows:

$$R_4=(u)\{(R_0)\mathrm{Exp}[x-(2y[(1/L_1)-(1/L_2)]L_1(J_1-J_6)/(J_1-J_2))]\},$$

where $\mathrm{Exp}[x-(2y[(1/L_1)-(1/L_2)]L_1(J_1-J_6)/(J_1-J_2))]$ is an exponentiation function that makes the expression within the brackets the exponent of the preceding entity.

What is claimed is:

1. A method of determining reflectivity of a semiconductor laser facet, comprising the steps of:
   (a) fabricating, with equal facet reflectance $R_0$, a first semiconductor laser with a first cavity length $L_1$ and a second semiconductor laser with a second cavity length $L_2$, where the first semiconductor laser has a first facet and a second facet;
   (b) determining the facet reflectance $R_0$;
   (c) measuring a threshold current density $J_1$ of the first semiconductor laser;
   (d) measuring a threshold current density $J_2$ of the second semiconductor laser;
   (e) if the reflectance of the first facet of the first semiconductor laser is modified and the second facet of the first semiconductor laser is not modified then setting u=1, x=1, and y=1;
   (f) if the reflectance of the first facet and the second facet of the first semiconductor laser are modified to the same extent then setting u=1, x=1, and y=0.5;
   (g) if the reflectance of the first facet of the first semiconductor laser is not modified and the second facet of the first semiconductor laser is modified then setting u=1, x=1, and y=1;
   (h) measuring a threshold current density $J_3$ of the modified first semiconductor laser; and
   (i) determining the reflectance of each modified facet of the first semiconductor laser as follows:

$$R_1=(u)\{(R_0)\mathrm{Exp}[x-(2y[(1/L_1)-(1/L_2)]L_1(J_1-J_3)/(J_1-J_2))]\},$$

where $\mathrm{Exp}[x-(2y[(1/L_1)-(1/L_2)]L_1(J_1-J_3)/(J_1-J_2))]$ is an exponentiation function that makes the expression within the brackets the exponent of the preceding entity.

2. The method of claim 1, further including the steps:
   (a) if the reflectance of the first facet and the second facet of the first semiconductor laser were modified to the same extent in claim 1 and if the reflectance of the first facet of the first semiconductor laser is further modified and the second facet of the first semiconductor laser is not further modified then setting u equal to the reflectance of the first facet of the first semiconductor laser as modified in claim 1, x=0, and y=1;

(b) if the reflectance of the first facet and the second facet of the first semiconductor laser were modified to the same extent in claim 1 and if the reflectance of the first facet of the first semiconductor laser and the second facet of the first semiconductor laser are further modified to the same extent then setting u equal to the reflectance of the first facet of the first semiconductor laser as modified in claim 1, x=0, and y=0.5;

(c) measuring a threshold current density $J_4$ of the further modified first semiconductor laser; and (d) determining the facet reflectance of the further modified first semiconductor laser as follows:

$$R_2=(u)\{(R_0)\text{Exp}[x-(2y[(1/L_1)-(1/L_2)]L_1(J_1-J_4)/(J_1-J_2))]\},$$

where $\text{Exp}[x-(2y[(1/L_1)-(1/L_2)]L_1(J_1-J_4)/(J_1-J_2))]$ is an exponentiation function that makes the expression within the brackets the exponent of the preceding entity.

3. The method of claim 2, further including the steps:

(a) if the reflectance of the first facet of the first semiconductor laser was further modified in claim 2 and if the reflectance of the first facet of the first semiconductor laser is yet further modified then setting u=$R_2$, x=0, and y=1;

(b) measuring a threshold current density $J_5$ of the yet further modified first semiconductor laser; and (c) determining the facet reflectance of the yet further modified first semiconductor laser as follows:

$$R_3=(u)\{(R_0)\text{Exp}[x-(2y[(1L_1)-(1L_2)]L_1(J_1-J_5)/(J_1-J_2))]\},$$

where $\text{Exp}[x-(2y[(1/L_1)-(1/L_2)]L_1(J_1-J_5)/(J_1-J_2))]$ is an exponentiation function that makes the expression within the brackets the exponent of the preceding entity.

4. The method of claim 1, further including the steps:

(a) if the reflectance of the first facet of the first semiconductor laser is not modified and the second facet of the first semiconductor laser is modified as in claim 1 and if the reflectance of the first facet of the first semiconductor laser is further modified and the second facet of the first semiconductor laser is not further modified then setting u=1, x=1, and y=1;

(b) if the reflectance of the first facet of the first semiconductor laser is not modified and the second facet of the first semiconductor laser is modified as in claim 1 and if the reflectance of the second facet of the first semiconductor laser is further modified and the first facet of the first semiconductor laser is not further modified then setting u equal to the reflectance $R_1$ of the second facet of the first semiconductor laser, x=0, and y=1;

(c) measuring a threshold current density $J_6$ of the modified first semiconductor laser; and (d) determining the reflectance of each modified facet of the first semiconductor laser as follows:

$$R_4=(u)\{(R_0)\text{Exp}[x-(2y[(1/L_1)-(1/L_2)]L_1(J_1-J_6)/(J_1-J_2))]\},$$

where $\exp[x-(2y[(1/L_1)-(1L_2)]L_1(J_1-J_6)/(J_1-J_2))]$ is an exponentiation function that makes the expression within the brackets the exponent of the preceding entity.

5. The method of claim 1, further including the steps of:

(a) fabricating, with equal facet reflectance $R_0$, a plurality of first semiconductor lasers each with a first cavity length $L_2$ and a plurality of second semiconductor lasers each with a second cavity length $L_2$, where the plurality of first semiconductor lasers each have a first facet and a second facet;

(b) measuring a threshold current density $J_1$ for each of the plurality of first semiconductor lasers;

(c) determining the average threshold current density of the results of step (b) and setting $J_1$ equal thereto;

(d) measuring a threshold current density $J_2$ for each of the plurality of second semiconductor lasers; and (e) determining the average threshold current density of the results of step (d) and setting $J_2$ equal thereto.

6. The method of claim 1, wherein the step of fabricating, with equal facet reflectance $R_0$, a first semiconductor laser with a first cavity length $L_1$ and a second semiconductor laser with a second cavity length $L_2$, where the first semiconductor laser has a first facet and a second facet is comprised of the step of fabricating, with equal facet reflectance $R_0$, a first semiconductor laser with a first cavity length $L_1$ and a second semiconductor laser with a second cavity length $L_2$, where the first semiconductor laser has a first facet and a second facet, and where $L_1$ is shorter than $L_2$.

7. The method of claim 1, wherein the step of determining the facet reflectance $R_0$ is comprised of the step of determining the facet reflectance $R_0$ as follows:

$$R_0=[(n_L-n_M)/(n_L+n_M)]^2,$$

where $n_L$ is the index of refraction of either the first semiconductor laser, and where $n_M$ is the index of refraction of a transmission medium.

8. The method of claim 7, further including the step of calculating $n_L$ as follows:

$$n_L=\lambda_0[(\lambda_0/2L)(1/d\lambda_0)+(-1\times10^{-4}\text{ cm}^{-1})],$$

where $\lambda_0$ is a free space wavelength of either the first semiconductor laser or the second semiconductor laser in question; where $d\lambda_0$ is the wavelength mode spacing of the semiconductor laser in question, and where L is a cavity length of either the first semiconductor laser or the second semiconductor laser in question.

* * * * *